(12) United States Patent
Fu et al.

(10) Patent No.: US 8,231,248 B2
(45) Date of Patent: Jul. 31, 2012

(54) LED UNIT

(75) Inventors: Ren-Tao Fu, Shenzhen (CN); Chin-Chung Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 222 days.

(21) Appl. No.: 12/687,879

(22) Filed: Jan. 15, 2010

(65) Prior Publication Data

US 2011/0110098 A1    May 12, 2011

(30) Foreign Application Priority Data

Nov. 9, 2009    (CN) .......................... 2009 1 0309435

(51) Int. Cl.
  *F21V 3/00*  (2006.01)
  *F21V 5/00*  (2006.01)
  *F21V 7/00*  (2006.01)

(52) U.S. Cl. .................................. 362/311.02; 362/308

(58) Field of Classification Search ............. 362/311.02, 362/308, 297, 304, 307, 309, 296.1, 327, 362/328, 329, 346
See application file for complete search history.

(56) References Cited

U.S. PATENT DOCUMENTS

| | | | | |
|---|---|---|---|---|
| 2,254,962 A * | 9/1941 | Bitner et al. | .................. | 362/327 |
| 6,547,423 B2 * | 4/2003 | Marshall et al. | .............. | 362/333 |
| 7,222,995 B1 * | 5/2007 | Bayat et al. | .................. | 362/327 |
| 7,347,603 B2 * | 3/2008 | Ikeda et al. | .................. | 362/555 |
| 7,473,013 B2 * | 1/2009 | Shimada | ...................... | 362/327 |
| 7,934,858 B2 * | 5/2011 | Nakamura | ............... | 362/311.09 |
| 2001/0007527 A1 * | 7/2001 | Lammers et al. | ............. | 362/294 |
| 2004/0264199 A1 * | 12/2004 | Shu et al. | ...................... | 362/327 |

* cited by examiner

*Primary Examiner* — David Crowe
(74) *Attorney, Agent, or Firm* — Altis Law Group, Inc.

(57) ABSTRACT

An LED unit includes an LED and a lens receiving the LED. The lens includes a first light-incident face confronting the LED to refract the light emitted from the LED with a small angle into the lens, a second light-incident face surrounding the LED to refract the light emitted from the LED with a large angle into the lens, a light-reflecting face to reflect the light from the second light-incident face towards a top of the LED, a first light-emergent face to refract the light from the first light-incident face out of the lens, and a second light-emergent face to refract the light from the light-reflecting face out of the lens.

16 Claims, 3 Drawing Sheets

LED UNIT

BACKGROUND

1. Technical Field

The present disclosure relates to a light emitting diode (LED) unit and, more particularly, to an LED unit having a lens which can produce an effectively converged light beam.

2. Description of Related Art

LEDs, available since the early 1960's and because of their high light-emitting efficiency, have been increasingly used in a variety of occasions, such as residential, traffic, commercial, and industrial occasions. Conventionally, light directly output from the LED does not have a desirable pattern; therefore, a light-adjusting element, such as a lens, is used with the LED to modulate the light pattern thereof.

However, a typical lens generally has a limited light-converging capability; that is, the light passing through the lens cannot be effectively converged to have a small light-emergent angle. Thus, the light pattern output from the lens may have a yellow annulus or shining annulus appearing at a periphery thereof, adversely affecting illumination effect of the lens.

What is needed, therefore, is an LED unit which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
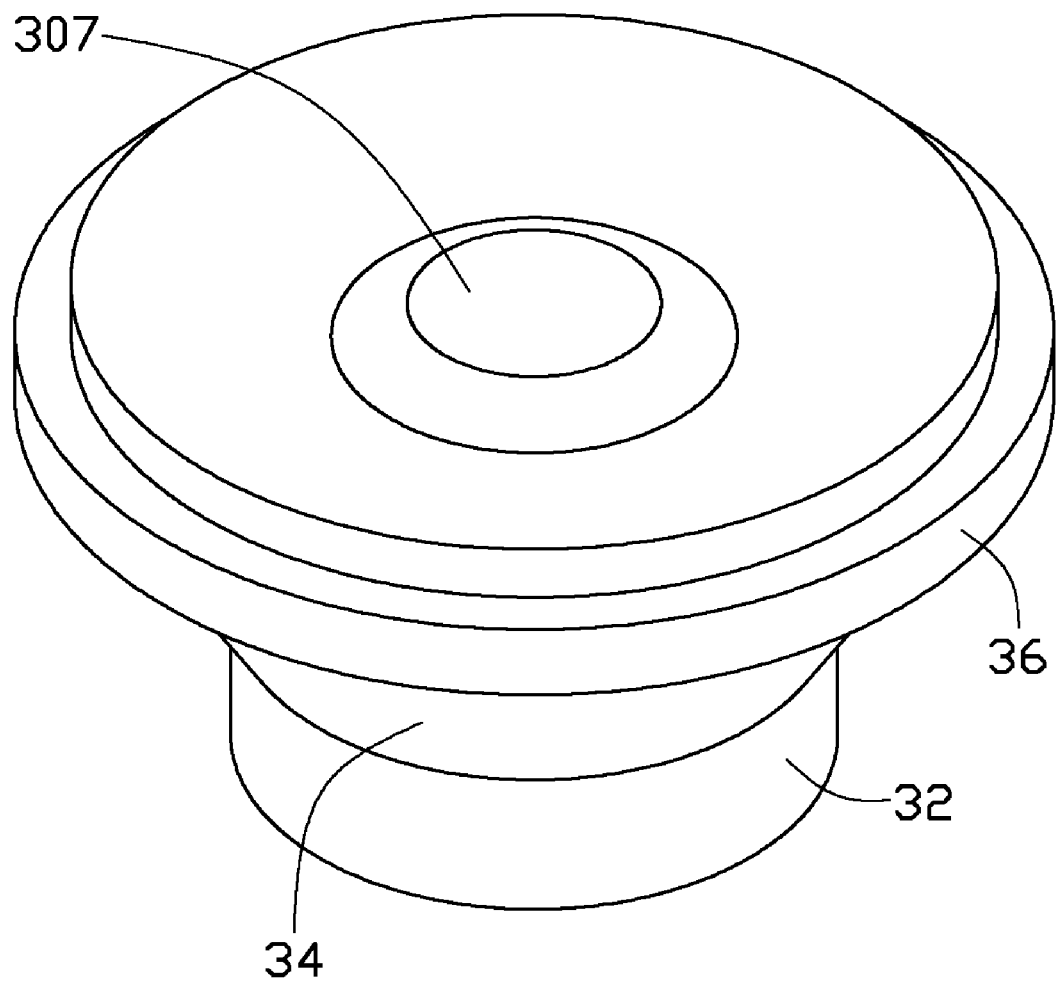
FIG. 1 is an isometric view of a lens of an LED unit of the disclosure.
Figure 3:
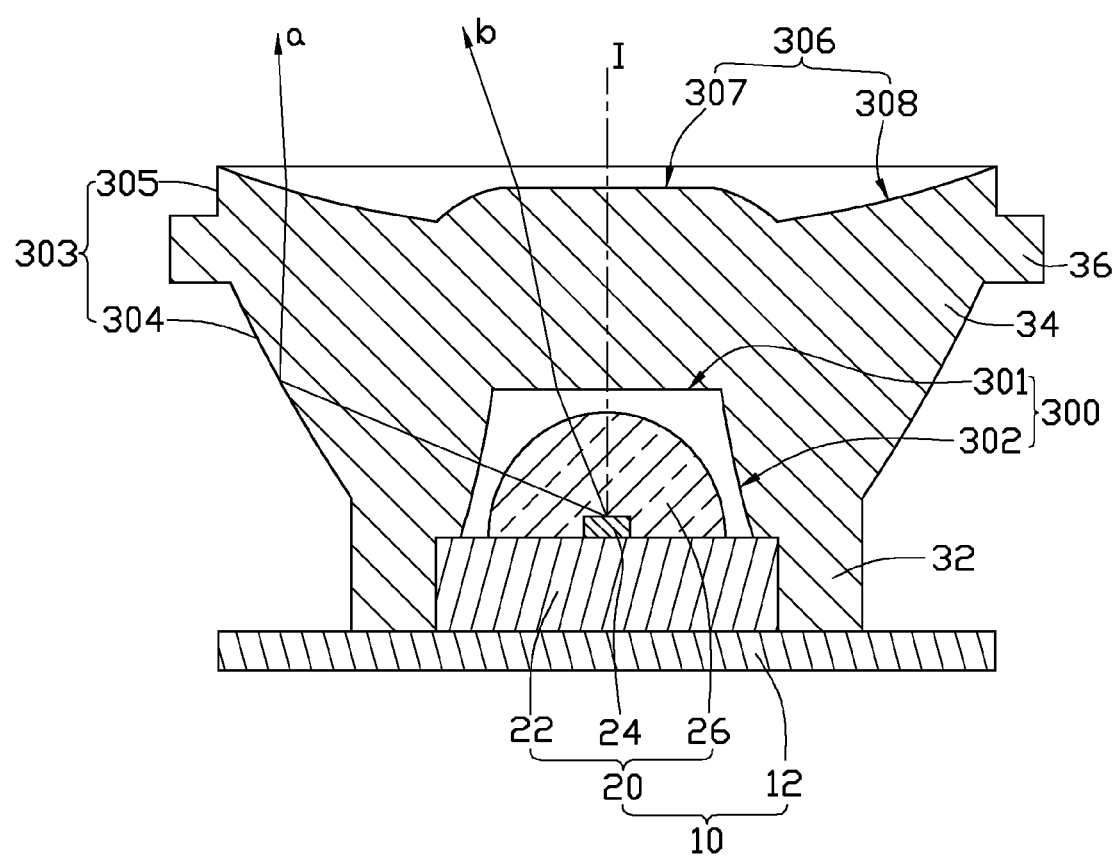
FIG. 3 shows a cross-section of the LED unit with the lens of FIG. 1.

Referring to FIGS. 1 and 3, an LED unit of the present disclosure is illustrated. The LED unit includes an LED module 10 and a lens 30 mounted on the LED module 10. The LED module 10 includes a printed circuit board 12 and an LED 20 mounted on the printed circuit board 12. The printed circuit board 12 may be a MCPCB (Metal Core Printed Circuit Board), a CPCB (Ceramic Printed Circuit Board) or other type PCBs which have good heat dissipation capability. The LED 20 includes a heat-conducting base 22, an LED die 24 mounted on a top of the base 22, and an encapsulant 26 covering the LED die 24 and fixed on the top of the base 22. The base 22 of the LED 20 is soldered on the printed circuit board 12 to conduct heat generated by the LED die 24 to the printed circuit board 12. In addition, the LED die 24 is electrically connected with the printed circuit board 12 via the base 22. The LED die 24 may be an InGaN chip, an InGaAs chip, a GaP chip or other suitable chips which could generate visible light with a desirable color. The encapsulant 26 is made by epoxy, silicon, glass or other transparent materials which have good light-permeable and water-proof capabilities. Phosphor may be doped within the encapsulant 26 to adjust the color of the light emitted from the LED die 24. The encapsulant 26 is shaped like a dome so as to collimate the light from the LED die 24 into a converged beam. The LED 20 has an optical axis I, around which the light emitted from the encapsulant 26 is symmetrical in a surrounding space.

Figure 2:
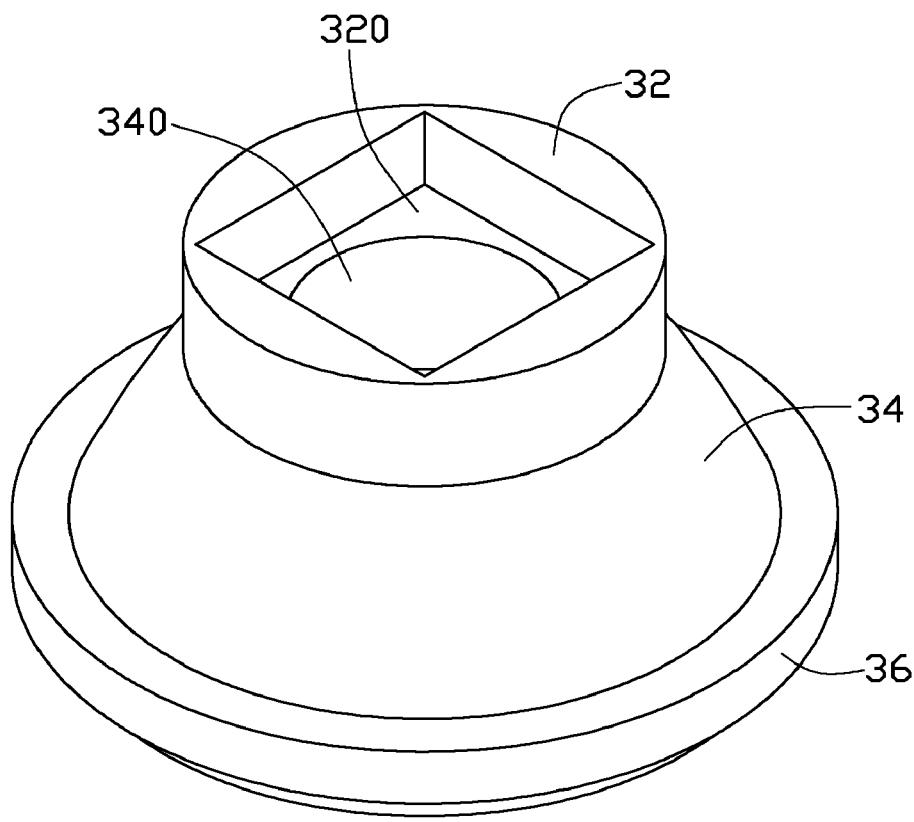
FIG. 2 is an inverted view of the lens of FIG. 1.

Also referring to FIG. 2, the lens 30 is made from transparent materials such as PC (polycarbonate) or PMMA (polymethyl methacrylate). The lens 30 includes a substrate 32, an optical member 34 extending upwardly from the substrate 32 and a flange 36 extending outwardly from a circumference of the optical member 34. The substrate 32 has a circular configuration with a rectangular window 320 defined in a bottom face thereof. The window 320 has an area similar to that of the base 22 of the LED 20 for receiving the base 22 of the LED 20 therein. A cavity 340 is defined in the interior of the lens 30. The cavity 340 is located above a center of and communicates with the window 320 to further receive the encapsulant 26 of the LED 20 therein. The cavity 340 has a shape of a truncated cone. A diameter of the cavity 340 gradually decreases from a bottom towards a top of the lens 30. An inner face of the lens 30 facing the encapsulant 26 of the LED 20 functions as a first light-incident face 301 of the lens 30 to receive the light emitted from the LED 20 with a small light-emergent angle (such the light b shown in FIG. 3). Another inner surface of the lens 30 surrounding the encapsulant 26 of the LED 20 functions as a second light-incident face 302 of the lens 30 to receive the light emitted from the LED 20 with a large light-emergent angle (such as the light a shown in FIG. 3). The first light-incident face 301 is planar, and the second light-incident face 302 is curved and slightly protruding inwardly towards the LED 20. The second light-incident face 302 has a curvature gradually decreasing from the bottom towards the top of the lens 30, ranging between 0.05 mm$^{-1}$ and 0.08 mm$^{-1}$. The first light-incident face 301 and the second light-incident face 302 cooperatively form a light-incident face 300 to refract all of the light of the LED 20 into the lens 30.

The optical member 34 has an upwardly-expanding bowl shape. An outer circumference of the optical member 34 functions as a light-reflecting face 303 of the lens 30 to totally reflect the light transferred from the second light-incident face 302 towards the top of the lens 30. Alternatively, the light-reflecting face 303 can be further coated with a reflective layer (such as aluminum layer or silver layer) for promoting light reflection. The flange 36 is located on the light-reflecting face 303 and adjacent to a top of the optical member 34. The flange 36 is for being pressed by a clip against the printed circuit board 12 to thereby secure the lens 30 on the printed circuit board 12. The light-reflecting face 303 is divided by the flange 36 into a first light-reflecting face 304 and a second light-reflecting face 305. The first light-reflecting face 304 is conical and gradually expands from the bottom towards the top of the lens 30. The first light-reflecting face 304 has a curvature firstly increasing and then decreasing from the bottom towards the top of the lens 30, ranging between 0.02 mm$^{-1}$ and 0.06 mm$^{-1}$. The second light-reflecting face 305 is vertical and has a zero curvature.

A top face of the optical member 34 is concaved downwardly to form a conical second light-emergent face 308. The second light-emergent face 308 directly connects with the second light-reflecting face 305. A protrusion (not labeled) is protruded upwardly from a central area of the top face of the optical member 34. The protrusion has a flat top face and a curved circumferential face continuous from the flat top face. The flat top face and the curved circumferential face of the protrusion cooperatively form a first light-emergent face 307 of the lens 30. The first light-emergent face 307 mostly takes charge for the light transmitted from the first light-incident face 301, the second light-emergent face 308 mostly takes charge for the light totally reflected by the light-reflecting face 303, to thereby refract nearly all of the light from the LED 20 out of the lens 30 within a small light-emergent angle. The first light-emergent face 307 has a curvature ranging between 0 and 0.9 mm$^{-1}$, and the second light-emergent face 308 has a curvature ranging between 0 and 0.12 mm$^{-1}$. The first-emergent face 307 and the second light-emergent face 308 cooperatively form a light-emergent face 306 to refract the light within the lens 30 towards a place above the lens 30.

Being adjusted by the first light-incident face 301, the second light-incident face 302, the first light-reflecting face 304, the second light-reflecting face 305, the first light-emergent face 307 and the second light-emergent face 308, the light emitted from the LED 20 could be effectively converged within a small angle, thereby preventing a periphery of a light pattern output by the LED 20 via the lens 30 from being yellow or shining.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. An LED (light emitting diode) unit, comprising:
   an LED; and
   a lens mounted on the LED, the lens comprising a light-incident face adjacent to the LED, a light-emergent face remote from the LED, and a light-reflecting face between the light-incident face and the light-emergent face, wherein light emitted from the LED with a small angle is refracted by the light-incident face and the light-emergent face out of the LED unit, light emitted from the LED with a large angle is sequentially refracted by the light-incident face, reflected by the light-reflecting face and refracted by the light-emergent face out of the LED unit; and
   wherein the light-reflecting face comprises a first light-reflecting face and a second light-reflecting face having a curvature different from that of the first light-reflecting face;
   wherein a flange is protruded outwardly between the first light-reflecting face and the second light-reflecting face; and
   wherein the light-emergent face comprises a first light-emergent face and a second light-emergent face surrounding the first light-emergent face, the first light-emergent face comprising a flat top face, the flat top face of the first light-emergent face being located higher than the flange and lower than a joint of the second light-reflecting face and the second light emergent face.

2. The LED unit as claimed in claim 1, wherein the first light-reflecting face is conical and gradually expands upwardly along a bottom-to-top direction of the lens.

3. The LED unit as claimed in claim 1, wherein the curvature of the first light-reflecting face ranges between 0.02 mm$^{-1}$ and 0.06 mm$^{-1}$.

4. The LED unit as claimed in claim 1, wherein the curvature of the second light-reflecting face is 0.

5. The LED unit as claimed in claim 1, wherein the first light-reflecting face and the second light-reflecting face are discontinuous from each other.

6. The LED unit as claimed in claim 5, wherein the flange is located adjacent to a top of the lens.

7. The LED unit as claimed in claim 1, wherein the second light-emergent face directly connects the second light-reflecting face.

8. The LED unit as claimed in claim 7, wherein the first light-emergent face comprises a curved circumferential face surrounding the flat top face.

9. The LED unit as claimed in claim 7, wherein the second light-emergent face is concaved downwardly to have a conical shape.

10. The LED unit as claimed in claim 7, wherein the second light-emergent face has a curvature ranging between 0 and 0.12 mm$^{-1}$, and the first light-emergent face has a curvature ranging between 0 and 0.09 mm$^{-1}$.

11. The LED unit as claimed in claim 1, wherein the light-incident face comprises a first light-incident face facing the LED, and a second light-incident face surrounding the LED.

12. The LED unit as claimed in claim 11, wherein the first light-incident face is flat.

13. The LED unit as claimed in claim 11, wherein the second light-incident face is protruded towards the LED.

14. The LED unit as claimed in claim 13, wherein the second light-incident face has a curvature ranging between 0.05 mm$^{-1}$ and 0.08 mm$^{-1}$.

15. The LED unit as claimed in claim 11, wherein the lens has a window defined in a bottom thereof and a cavity defined in an interior thereof, the window communicating with the cavity, the window and the cavity together receiving the LED therein, the first and second light-incident faces being formed by the lens defining the cavity, the cavity having a shape of a truncated cone.

16. The LED unit as claimed in claim 1, wherein the flat top face of the first light-emergent face is located at a center of the light-emergent face and aligned with the LED.

* * * * *